(12) United States Patent
Sakurai

(10) Patent No.: US 6,400,212 B1
(45) Date of Patent: Jun. 4, 2002

(54) APPARATUS AND METHOD FOR REFERENCE VOLTAGE GENERATOR WITH SELF-MONITORING

(75) Inventor: Satoshi Sakurai, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/352,388

(22) Filed: Jul. 13, 1999

(51) Int. Cl.[7] .............................. G05F 1/10; G05F 3/02
(52) U.S. Cl. ...................... 327/539; 323/313; 323/198
(58) Field of Search ................................ 327/530, 538, 327/539, 198; 323/312, 313, 314, 315

(56) References Cited

U.S. PATENT DOCUMENTS

| | | | | |
|---|---|---|---|---|
| 4,588,941 A | * | 5/1986 | Kerth et al. ................ | 323/314 |
| 5,214,316 A | * | 5/1993 | Nagai ....................... | 307/272.3 |
| 5,302,861 A | | 4/1994 | Jelinek ..................... | 307/296.5 |
| 5,396,115 A | | 3/1995 | Coffman et al. ............ | 327/143 |
| 5,477,176 A | | 12/1995 | Chang et al. ................ | 327/143 |
| 5,521,489 A | * | 5/1996 | Fukami ....................... | 323/313 |
| 5,523,707 A | | 6/1996 | Levy et al. ................... | 326/52 |
| 5,602,502 A | | 2/1997 | Jiang ........................... | 327/143 |
| 5,610,506 A | | 3/1997 | McIntyre ..................... | 323/313 |
| 5,714,898 A | | 2/1998 | Kim ............................ | 327/143 |
| 5,796,244 A | * | 8/1998 | Chen et al. .................. | 323/313 |
| 5,814,995 A | * | 9/1998 | Tasdighi ..................... | 324/431 |
| 5,852,376 A | * | 12/1998 | Kraus ......................... | 327/143 |
| 5,856,742 A | * | 1/1999 | Vulih et al. ................. | 323/315 |
| 5,900,773 A | * | 5/1999 | Susak ......................... | 327/539 |
| 6,075,407 A | * | 6/2000 | Doyle ......................... | 327/539 |
| 6,091,287 A | * | 7/2000 | Salter et al. ................. | 327/543 |
| 6,236,249 B1 | * | 5/2001 | Choi et al. .................. | 327/143 |

* cited by examiner

Primary Examiner—Terry D. Cunnigham
Assistant Examiner—Quan Tra
(74) Attorney, Agent, or Firm—Stallman & Pollock LLP

(57) ABSTRACT

An apparatus and method for providing a reference voltage which provides a signal indicating when the reference voltage has reached a desired stable condition. This signal is obtained by comparing two test voltages which are interrelated and also related to the condition of the reference voltage.

13 Claims, 3 Drawing Sheets

APPARATUS AND METHOD FOR REFERENCE VOLTAGE GENERATOR WITH SELF-MONITORING

BACKGROUND OF THE INVENTION

1. Field of the Invention

The present invention relates to a circuit for providing a reference signal that can be used in conjunction with a circuit for signal processing, and that provides a way for the reference generating circuit to monitor itself to determine when the reference voltage is stable.

2. Description of Related Art

Bandgap based voltage and current generation circuits have been widely used to provide bias currents and reference voltages for analog and mixed signal integrated circuits. The circuits that receive bias currents and reference voltages often perform important signal processing functions and make decisions that can affect the overall operation of an integrated circuit. It is extremely important that the decisions not be affected by undesired fluctuation in the bias current or reference voltage. At the start-up of a semiconductor chip, the circuits that receive and rely upon the bias current or reference voltage can reach operable states before the bias current or reference voltage reaches it steady-state value. If this occurs at a point in time when the value of the bias current or reference voltage is unstable and at a small fraction of its steady-state values, the decisions made by the circuits that depend upon the bias current or reference voltage may be unpredictable. In order to prevent the unpredictable decisions from corrupting the chip function, the circuit that generates the bias current or reference voltage should output a signal indicating that the bias current or reference voltage has reached a condition necessary for proper operation of the chip.

One example of a prior art approach to providing a bandgap based reference voltage is disclose in U.S. Pat. No. 5,610,506, VOLTAGE REFERENCE CIRCUIT, (Issued Mar. 11, 1997). The '506 patent proposes a circuit that indicates that the voltage generated by the bandgap circuit is not valid and this information is used to enable or disable the other circuits of the chip.

The approach taken in the '506 patent concentrates on determining whether or not the supply voltage has reached a predetermined value. The focus of trying to determine whether or not the supply voltage has reached a specific value does not address the issue that arises as integrated circuits are powered by battery cells where the supply voltage cannot be assumed to be a fixed or certain value. Also, in order to maximize the operation of chips, circuits should be allowed to operate over as wide a range of power supply voltage as is possible. Thus, there is a need for generating a signal that indicates the proper operation of a bandgap circuit as soon as the generated voltage or current is stable enough to provide a bias current or reference voltage.

SUMMARY OF THE INVENTION

The method and apparatus of the invention provide a circuit that generates a reference voltage. The circuit also provides nodes that produce test voltages. These test voltages are interrelated and also relate to the state of the reference voltage. By comparing the test voltages, the circuit is able to make a determination as to when the reference voltage has reached a ready state. An important feature of the invention is that the test voltages are derived from the same circuit that generates the reference voltage. Thus, the determination that the reference voltage is suitable for use is made as quickly as possible, because the voltages being compared are part of the reference voltage circuit itself and are not derived from some other source.

DETAILED DESCRIPTION

Figure 1:
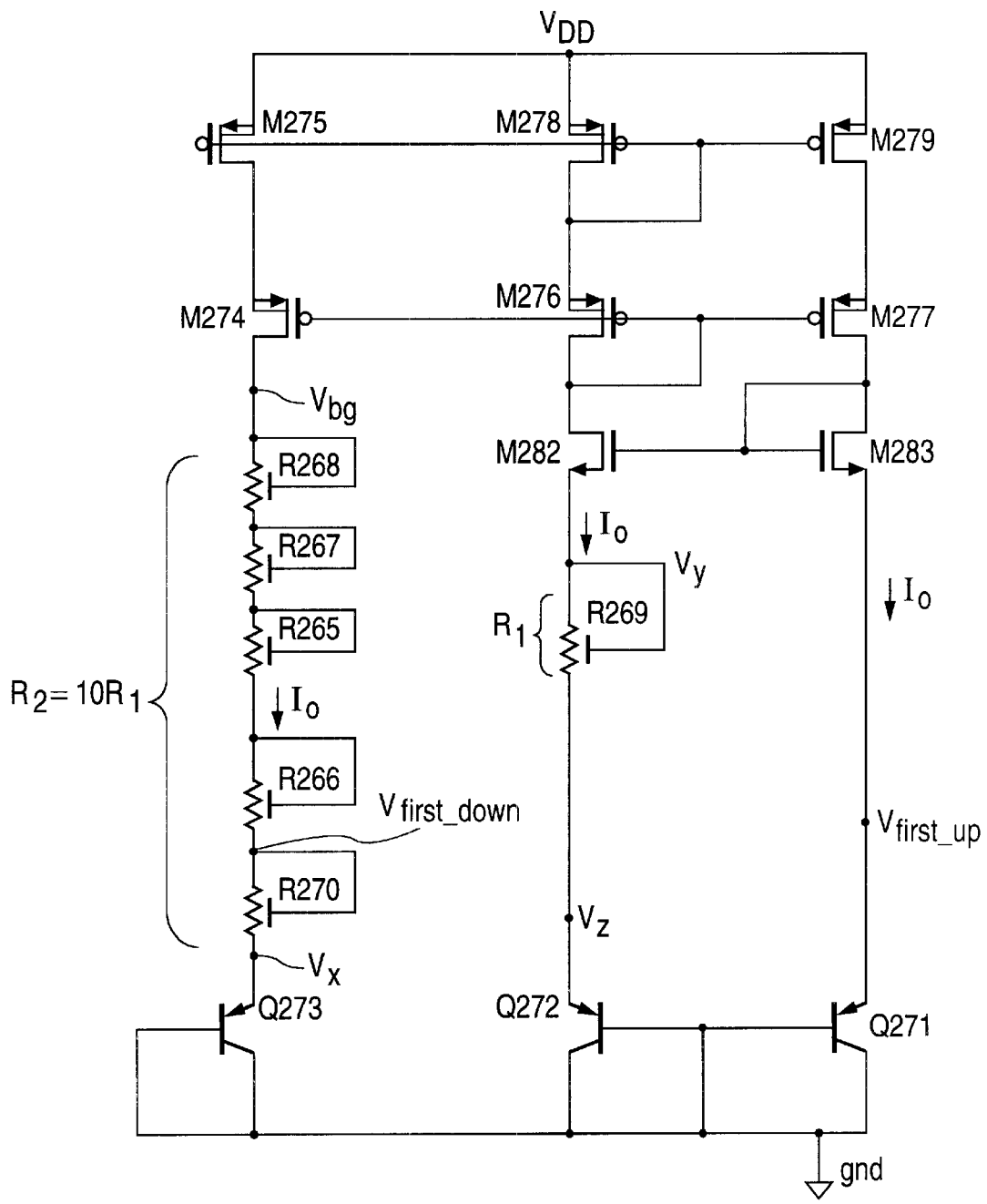
FIG. 1 is a circuit diagram illustrating an embodiment of the invention.

FIG. 1 is a detailed circuit diagram showing an embodiment of the present invention. The node Vbg in the FIG. 1 circuit provides an output voltage that can be used as a reference voltage for analog and mixed signal integrated circuits.

As shown in FIG. 1, MOSFETs M275 and M278 are configured to act as a current mirror wherein the output current from the drain of each of these devices is the same. Similarly, devices M278 and M279 are also coupled to act as a current mirror, so the current output from the drain of M279 will be the same as the current output from the drains of devices M275 and M278. In this current mirror configuration, the gates of each of the three MOSFETs are connected and the gate and drain of MOSFET M278 are also connected. While the devices shown in this configuration are P-channel device MOSFETs, one skilled in the art would recognize that other solid state devices could be used to serve the current mirror function.

MOSFETs M274, M276 and M277 are not necessary for the operation of the FIG. 1 circuit, but including these solid state devices in the circuitry improves the overall operation of the circuit. While the devices M274, M276 and M277 are shown as MOSFETs, other solid state devices could also be used.

Devices M282 and M283 are N-channel device MOSFETs that provide the function of ensuring that the voltages $V_y$ and $V_{first\_up}$ are equal. This is achieved because each of these devices is the same size, the gates are connected together, the devices are in saturation, and the devices have the same current Io flowing from their source terminals.

The drain of device M274 is connected to a series of resistors designated as R2 in the FIG. 1 circuit. The combined resistance of these resistors is equal to 10 times the resistance of resistor R1. Resistance R2 is then connected to the emitter of the diode-connected bipolar transistor Q273.

The source of the MOSFET M282 is connected to resistor R1 which in turn is connected to the emitter of the diode-connected PNP bipolar device Q272. The source of MOSFET M283 is connected to the emitter of another diode-connected PNP bipolar device Q271.

The emitter area of the Q272 transistor is 10 times the emitter area of the 271 transistor.

Because, for the FIG. 1 circuit, the current flowing through devices Q272 and 271 is equal, it can be determined that $V_Y - V_Z = V_t \ln 10$. This is derived from the fact that $V_Y$ and $V_{first\_up}$ are equal to each other and therefore $V_{first\_up} -$ $V_Z=V_Y-V_Z$. This relationship, in conjunction with known principles of bipolar devices, such as $V_{eb}=V_t*\ln(Io/Is)$ allows one to establish $V_Y-V_Z=V_t\ln 10$.

Figure 2A:
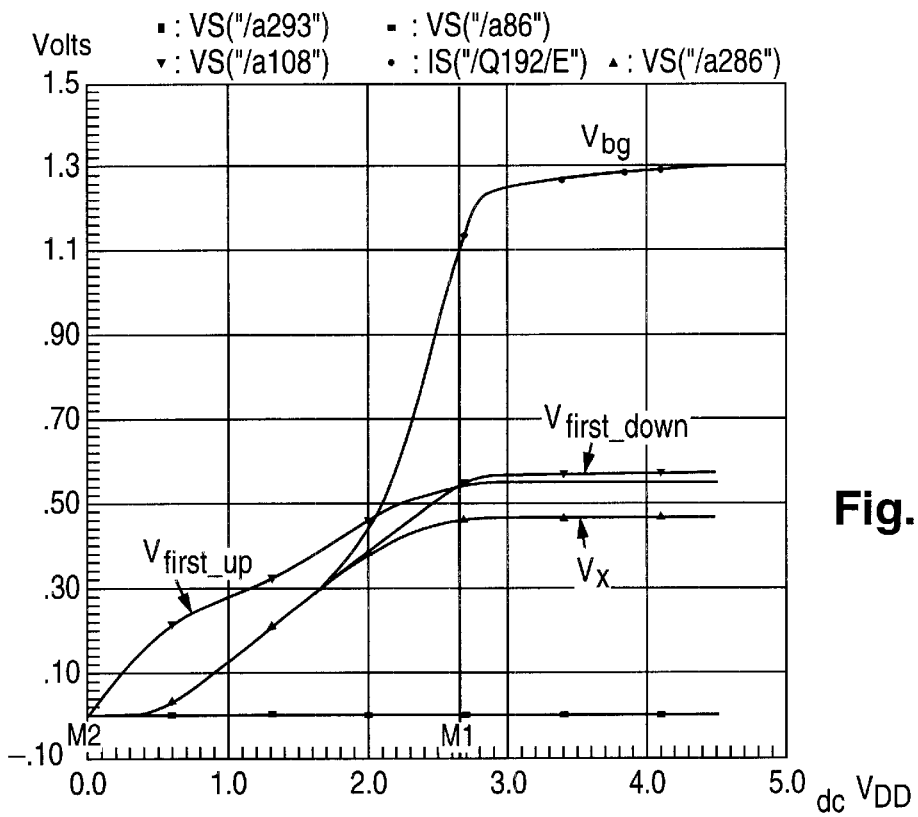
FIG. 2A is a diagram showing the voltage of different nodes of the circuit diagram shown in FIG. 1, as the circuit progresses from start-up to steady-state.
Figure 2B:
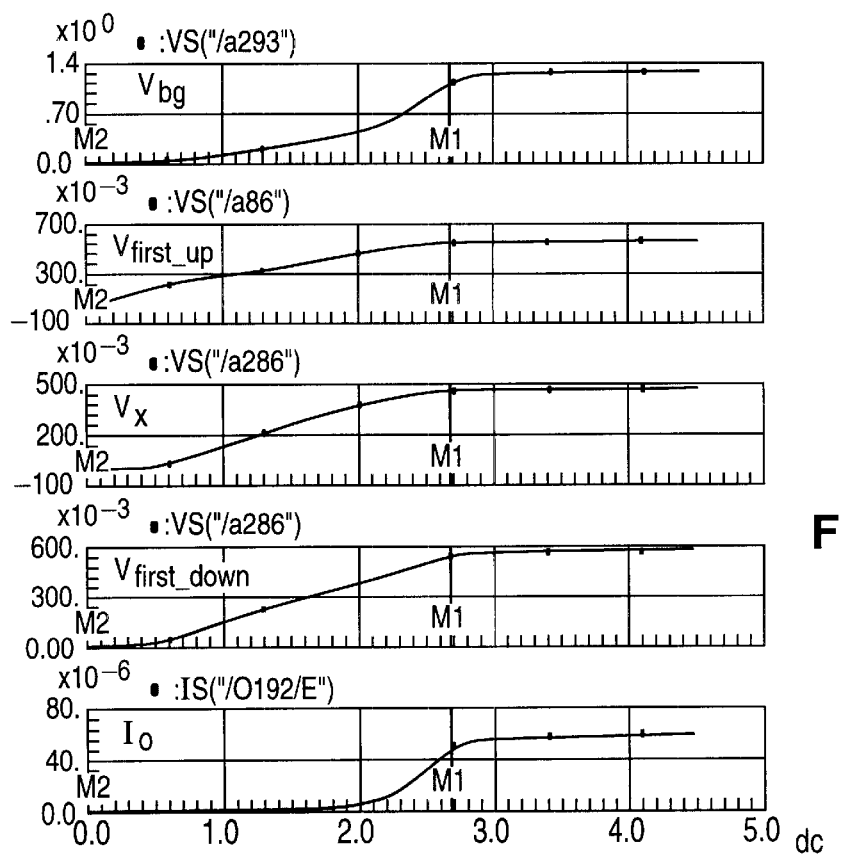
FIG. 2B is a diagram showing the voltage and current for different nodes and branches of the circuit shown in FIG. 1.

The voltage $V_{bg}$ is generated by sourcing current Io into device Q273 and resistance R2. FIGS. 2A–B show how the FIG. 1 circuit behaves as a function of the supply voltage $V_{DD}$. Over most of the range of $V_{DD}$, the following relationship is seen $V_{first\_up}-V_x=V_t\ln 10$. The only time this is not true is when current Io is zero. Also, we can see that $V_{bg}=V_x$ until $V_{DD}$ reaches some point above 0 volts. This is true because $V_{bg}=V_x+Io*R2$ and, where $V_{DD}$ is very small current Io will be very small.

Thus, as the bandgap circuit shown in FIG. 1 starts to come into full operation, $V_{bg}$ increases toward its steady-state point while $V_x$ remains $V_t\ln 10$ below $V_{first\_up}$. At a point somewhere between $V_{bg}$ and $V_X$, we can denote a node $V_{first\_down}$ the behavior of which is seen in FIG. 2A–B.

As shown in FIG. 1, $V_{first\_down}$ is positioned above node $V_x$ such that its voltage will be higher than $V_X$ and less that $V_{bg}$ where Io equals some value greater than zero. The behavior of the voltage at node $V_{first\_down}$ of FIG. 1 is shown in FIGS. 2A–B as a function of $V_{DD}$. From these plots, we can see that when $V_{first\_down}$ equals $V_{first\_up}$, the bandgap voltage $V_{bg}$ is near its final point and the bias current Io, is near its final value. Thus, by comparing $V_{first\_up}$ and $V_{first\_down}$, we can generate a signal $V_{ready}$ indicating the bandgap circuit is ready or very close to its final stage.

The voltage difference being compared here is $V_{first\_up}-V_{first\_up}V_{first\_down}$ which is very controlled and predictable. Also note that any attempt to improve the bandgap circuit itself will also result in the accuracy of the $V_{first\_up}-V_{first\_down}$.

While the above discussion focuses on the situation where the current Io through each of the branches is the same, one skilled in the art would realize that similar results could be obtained by using varying sizes of solid state devices, wherein the current flowing through each of the branches would be proportional to each other, but not necessarily equal.

Figure 3:
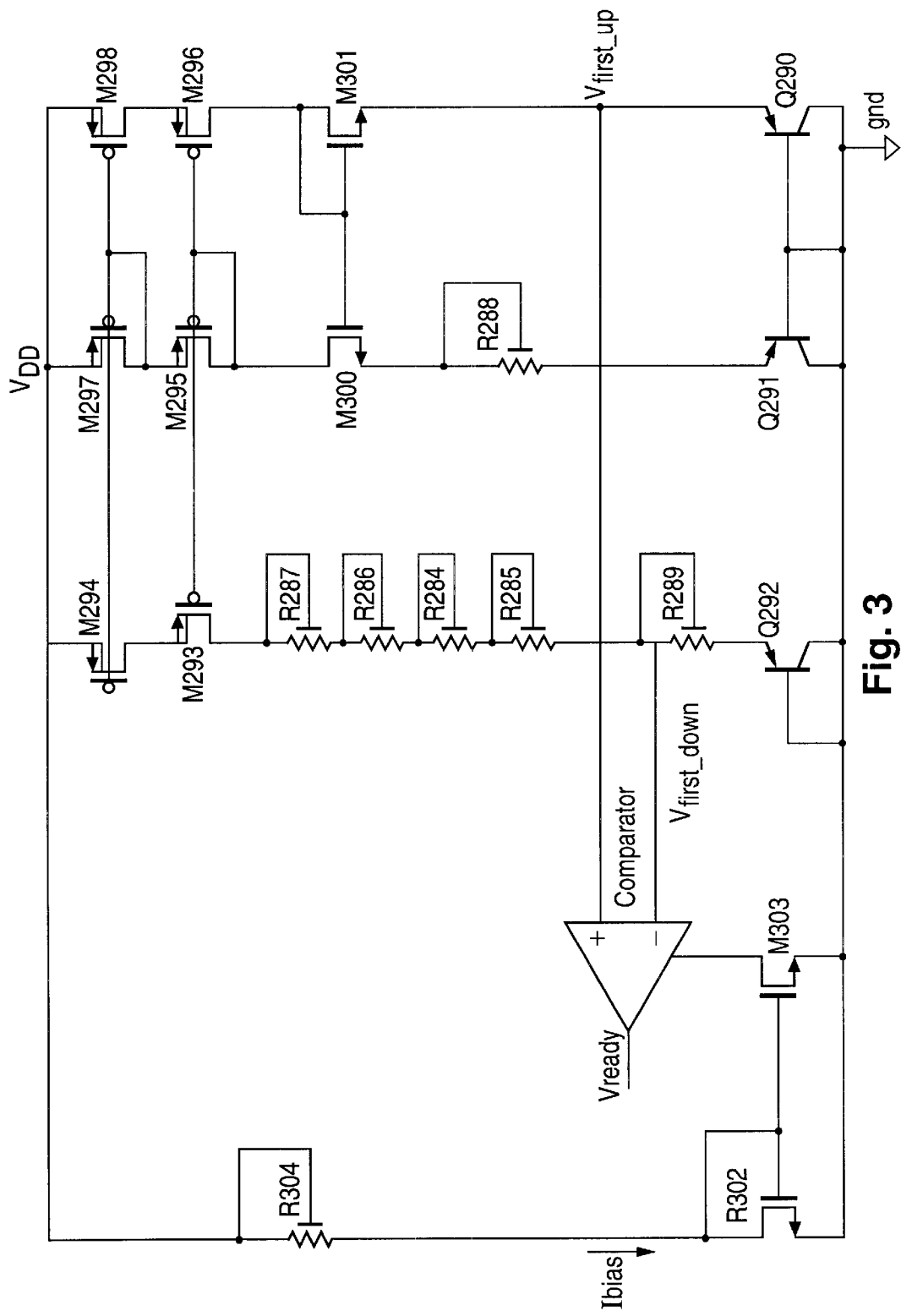
FIG. 3 is a circuit diagram illustrating an alternate embodiment of the invention.

FIG. 3 shows the FIG. 1 circuit including the generation of signal $V_{ready}$. Note that the comparator in FIG. 3 is being biased by current $I_{bias}$ which is independent of the bandgap circuit. This ensures that the comparator is operable long before the bandgap circuit is operating to produce a stable reference. The $I_{bias}$ current as shown in FIG. 3 is derived directly from $V_{DD}$. The circuit operates such that there will be enough current derived through the resistor R304 to bias the comparator long before the $V_{first\_down}$ is equal to or greater than the $V_{first\_up}$. The comparator receives the voltage $V_{first\_up}$ at its noninverting input, and the voltage $V_{first\_down}$ at its inverting input. When the comparator senses that $V_{first\_down}$ is equal to or greater than $V_{first\_up}$, it will output an active low signal $V_{ready}$ enabling the operation of decision making circuitry at the chip. Thus, the decision making circuitry will be enabled as soon as the test voltages of the reference generator circuit indicate that the reference voltage is stable, but not before.

While the method- and apparatus of the present invention have been described in terms of its presently preferred and alternate embodiments, those skilled in the art will recognize that the present invention may be practiced with modification and alteration within the spirit and scope of the appended claims. The specifications and drawings are, accordingly, to be regarded in an illustrative rather than a restrictive sense. Further, even though only certain embodiments have been described in detail, those having ordinary skill in the art will certainly understand that many modifications are possible without departing from the teachings thereof. All such modifications are intended to be encompassed within the following claims.

What is claimed is:

1. A monitoring circuit for determining when a reference voltage generated by a bandgap reference voltage circuit is stable, wherein the bandgap reference voltage circuit includes a current source configured to provide a first current and second current that is substantially proportioned to the first current, a first circuit branch that includes a first resistor wherein the first circuit branch is configured to receive the first current, a first solid state device coupled to the first circuit branch, wherein the first resistor is coupled between the current source and the first solid state device, a second circuit branch that is configured to receive the second current, and a second solid state device coupled to the second circuit branch, the reference voltage being provided to an external circuit that is different than the bandgap reference voltage circuit, the monitoring circuit comprising:

a first input node connected to the second circuit branch of the bandgap reference voltage circuit between the second solid state device and the current source to receive a first test voltage;

a second input node connected to the first circuit branch of the bandgap reference voltage circuit to receive a second test voltage therefrom; and a comparator circuit connected to the first input node to receive the first test voltage therefrom and to the second input node to receive the second test voltage therefrom, and that generates a digital enable output signal when the first test voltage is less than the second test voltage, the digital enable output signal being provided to the external circuit to enable operation of the external circuit, whereby the external circuit is enabled for operation utilizing the reference voltage only when the reference voltage is stable.

2. An apparatus including a reference generator circuit that generates a reference voltage that is provided to an external circuit that is different than the reference generator circuit, the apparatus comprising:

a current source configured to provide a first current and a second current that is substantially proportional to the first current;

a first circuit branch including a first resistor, wherein the first branch is configured to receive the first current;

a first solid state device coupled to the first branch;

wherein the first resistor is coupled between the current source and the first solid state device;

a second circuit branch that is configured to receive the second current;

a second solid state device coupled to the second circuit branch, and wherein the second circuit branch has a first reference node between the second solid state device and the current source with a first voltage;

wherein the first circuit branch has a bandgap reference node with the reference voltage and the first circuit branch has a second node with a second test voltage; and a comparator circuit that compares the first test voltage and the second test voltage and provides a digital enable output signal when the first test voltage is less than the second test voltage, the digital output enable signal being provided to the external circuit to enable operation of the external circuit, whereby the external circuit is enabled for operation utilizing the reference voltage only when the reference voltage is stable.

3. The apparatus of claim 2, and wherein the first solid state device and the second solid state device are bipolar transistors.

4. The apparatus of claim 3, and wherein the emitter area of the first solid state device is larger than the emitter area of the second solid state device.

5. The apparatus of claim 2, and wherein the current source comprises a first current mirror and a second current mirror.

6. The apparatus of claim 5, wherein the first current mirror comprises a third solid state device and a fourth solid state device, and the second current mirror comprises the third solid state device and a fifth solid state device.

7. An apparatus including a reference generator circuit that provides a reference signal to an external circuit that is different than the reference generator circuit, the apparatus comprising:

a first current mirror circuit configured to receive a control signal and in accordance with the control signal provide a first current;

a second current mirror circuit configured to receive the control signal and in accordance with the control signal provide a second current;

a first circuit branch configured to receive the first current, wherein the first circuit branch includes a first reference node having a reference voltage and a second reference node having a first test voltage;

a second circuit branch configured to receive the second current, wherein the second circuit branch includes a third reference node having a second test voltage; and a comparator circuit configured to compare to the first test voltage with the second test voltage, and that generates a digital enable output signal when the first test voltage is less than the second test voltage, the digital enable output signal being provided to the external circuit to enable operation of the external circuit, whereby the external circuit is enabled for operation only when the reference signal is stable.

8. The apparatus of claim 7, and wherein the first current and the second current are substantially equal.

9. The apparatus of claim 7, and further comprising:

a first solid state device coupled to the first current mirror by the first circuit branch;

a second solid state device coupled to the second current mirror by the second circuit branch;

wherein the first reference node and the second reference node are between the first current mirror and the first solid state device and are configured such that the reference voltage is greater than the first test voltage when the first current mirror is supplying current to the first branch; and wherein the third reference node is between the second current mirror and the second solid state device.

10. The apparatus of claim 9, and further comprising a third solid state device which is part of the first current mirror and part of the second current mirror.

11. The circuit of claim 10, and further comprising:

a third branch coupled to the third solid state device;

a fourth solid state device coupled to the third branch; and wherein a third current is supplied to the third branch through the third solid state device.

12. The circuit of claim 11, and wherein the first solid state device, the second solid state device and the fourth solid state device are bipolar devices, and wherein the emitter areas of the first solid state device and the fourth solid state device are greater than the emitter area of the second solid state device.

13. A method of determining when a reference voltage generated by a bandgap reference voltage circuit is stable, wherein the bandgap reference voltage circuit includes a current source configured to provide a first current and second current that is substantially proportioned to the first current, a first circuit branch that includes a first resistor wherein the first circuit branch is configured to receive the first current, a first solid state device coupled to the first circuit branch, wherein the first resistor is coupled between the current source and the first solid state device, a second circuit branch that is configured to receive the second current, and a second solid state device coupled to the second circuit branch, the reference voltage being provided to an external circuit that is different than the bandgap reference voltage circuit, the method comprising:

providing a first test voltage at a first node that is connected to the second circuit branch of the bandgap reference voltage circuit between the second solid state device and the current source;

providing a second test voltage at a second node that is connected to the first circuit branch of the bandgap reference voltage circuit; and comparing the first test voltage and the second test voltage;

generating a digital enable output signal when the first test voltage is less than the second test voltage; and providing the enable output signal to the external circuit to enable operation of the external circuit, whereby the external circuit is enabled for operation utilizing the reference voltage only when the reference voltage is stable.

* * * * *